United States Patent [19] [11] 3,955,149
Trilling [45] May 4, 1976

[54] DIFFERENTIAL AMPLIFIER HAVING ACTIVE FEEDBACK CIRCUITRY

[76] Inventor: Ted R. Trilling, Berkshire Road, R.D. 3, Doylestown, Pa. 18901

[22] Filed: Oct. 23, 1974

[21] Appl. No.: 517,118

Related U.S. Application Data

[62] Division of Ser. No. 263,505, June 16, 1972, Pat. No. 3,845,404.

[52] U.S. Cl. ............................... 330/30 D; 330/59; 330/85
[51] Int. Cl.² ............................................. H03F 3/45
[58] Field of Search ................ 330/69, 30 D, 59, 85

[56] References Cited
UNITED STATES PATENTS

| | | | |
|---|---|---|---|
| 3,275,945 | 9/1966 | Walker et al. | 330/30 D |
| 3,480,872 | 11/1969 | Breuer | 330/69 X |
| 3,611,173 | 10/1971 | Goulding et al. | 330/59 |
| 3,699,468 | 10/1972 | Harmgordt | 330/59 X |
| 3,811,094 | 5/1974 | Lee | 330/59 |

*Primary Examiner*—James B. Mullins
*Attorney, Agent, or Firm*—R. S. Sciascia; Henry Hansen

[57] ABSTRACT

Common-mode and differential-mode active electrical and electro-optic feedback systems are formed with a plurality of physically interchangeable circuits. One of a plurality of input stage amplifiers can be connected to one of a plurality of loads through intermediate and output stage amplifiers. A plurality of interchangeable feedback stage amplifiers are then connected from various stage amplifiers back to the input stage amplifier. Such arrangements control the gain and the input and output impedances of the system independently for both the common and differential-modes.

6 Claims, 26 Drawing Figures

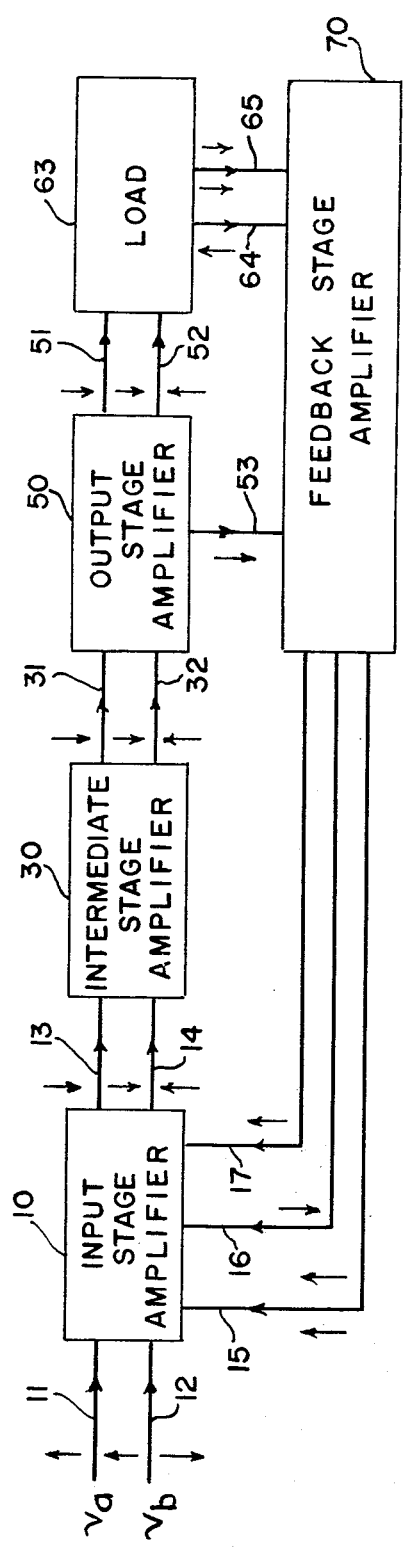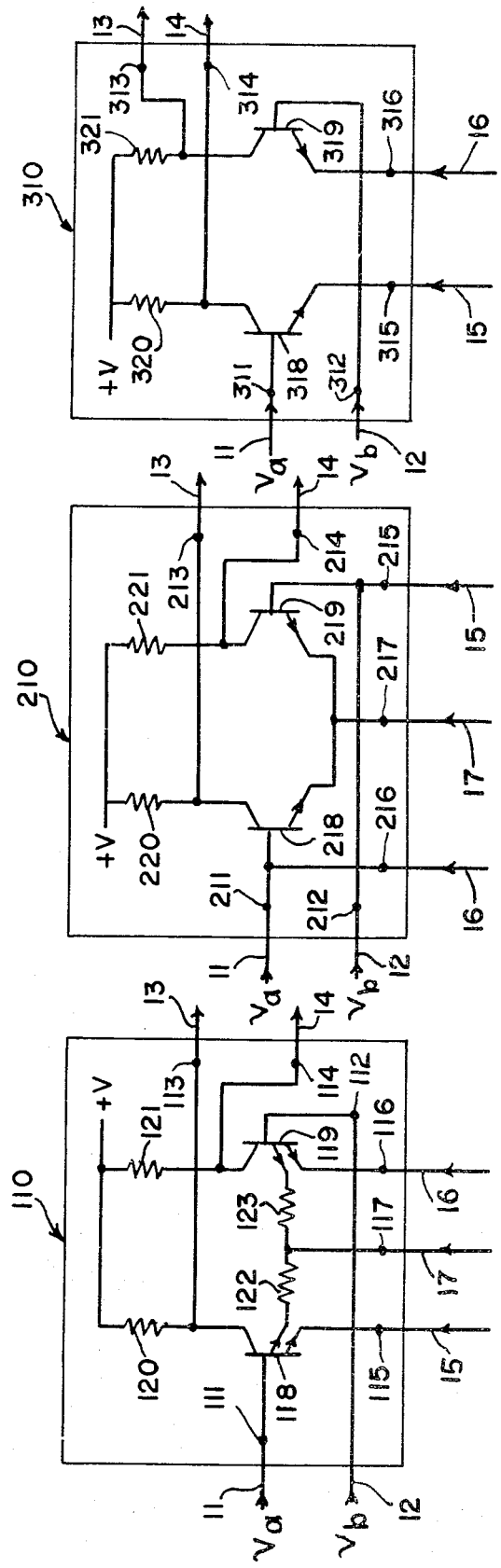

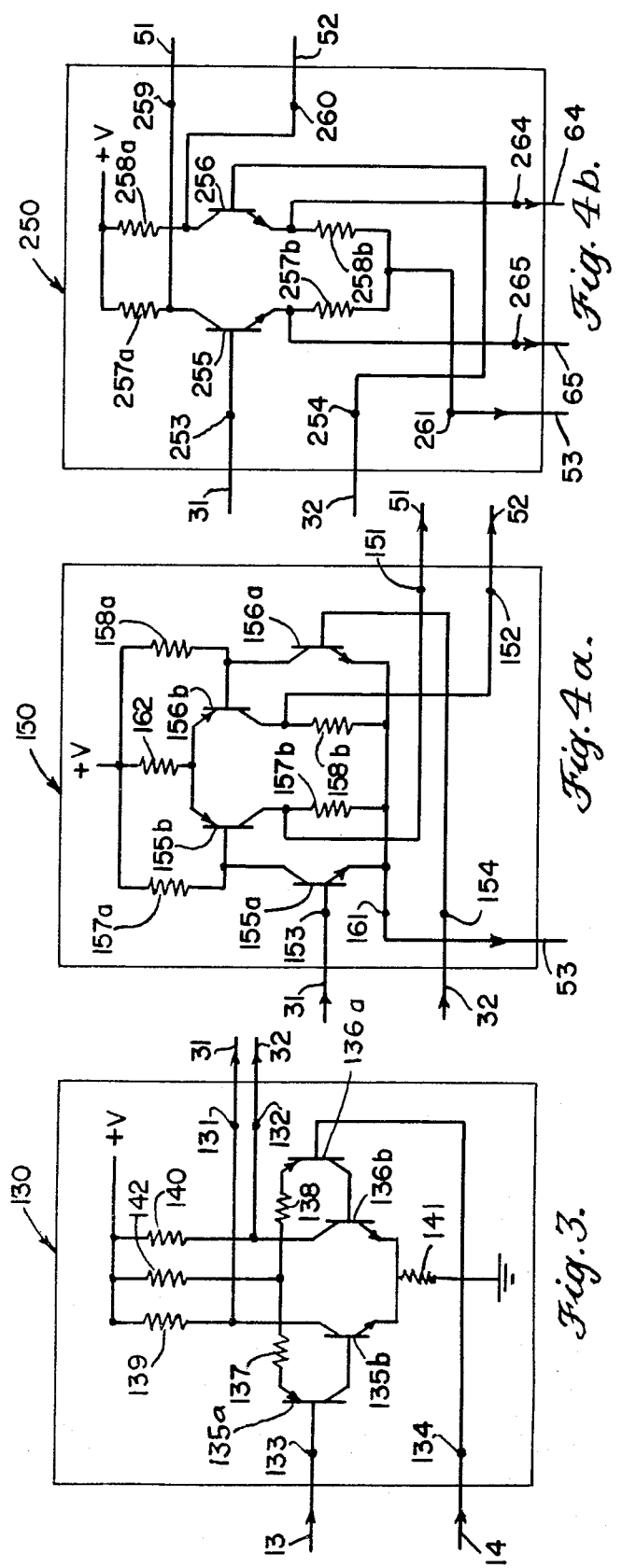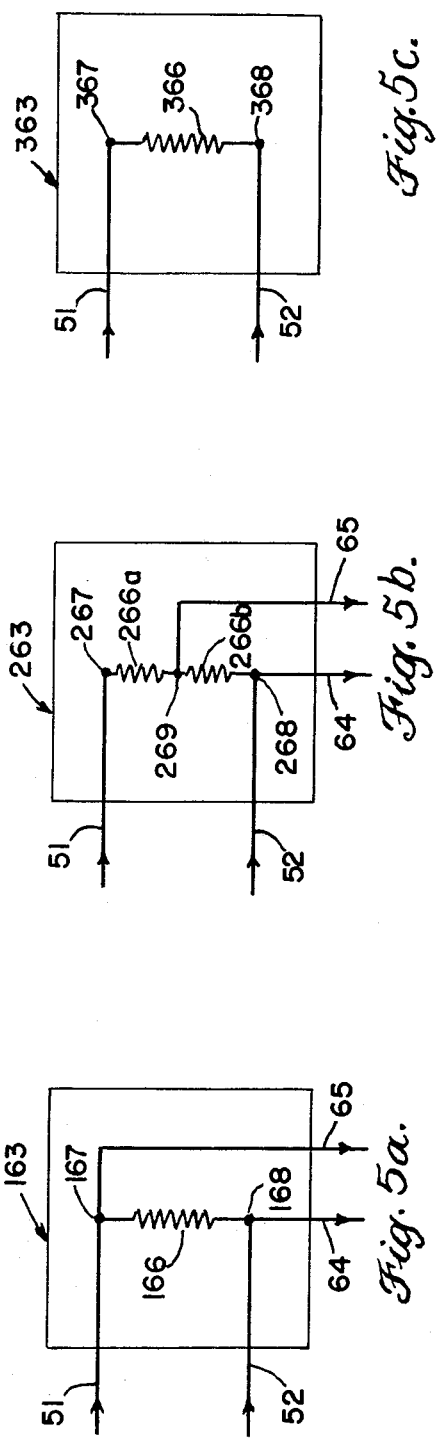

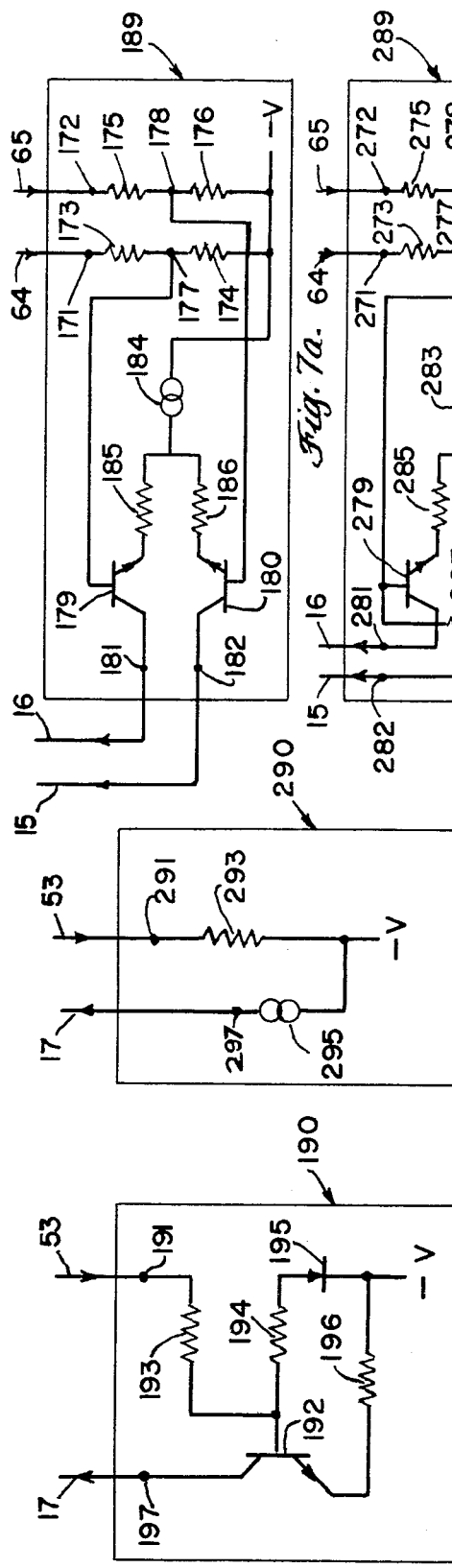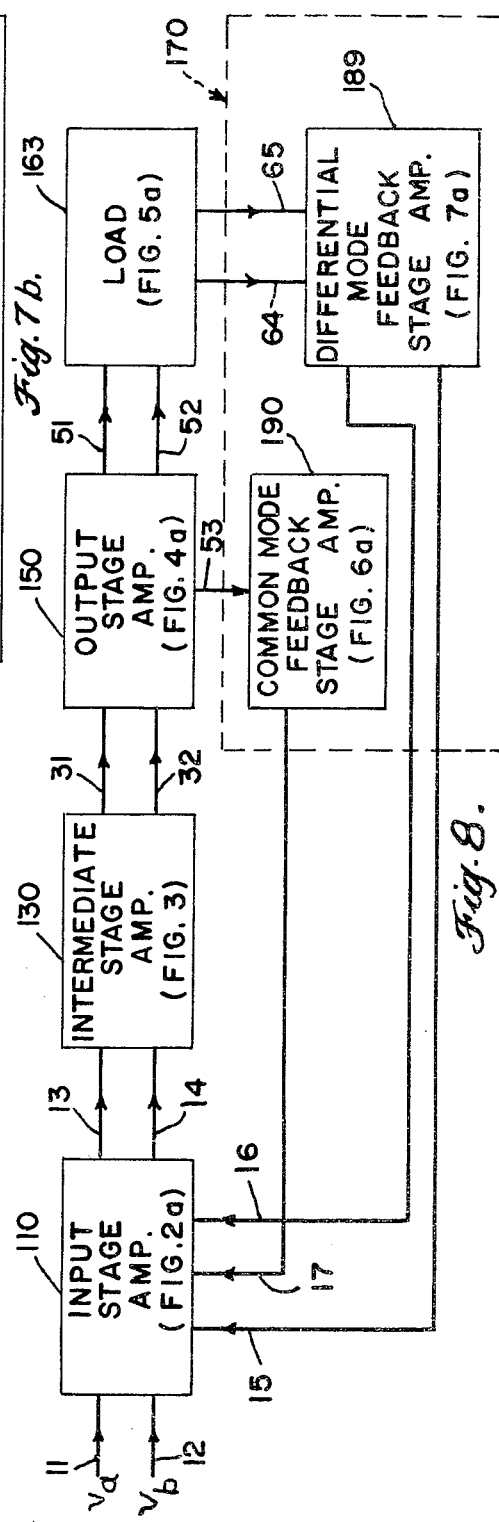

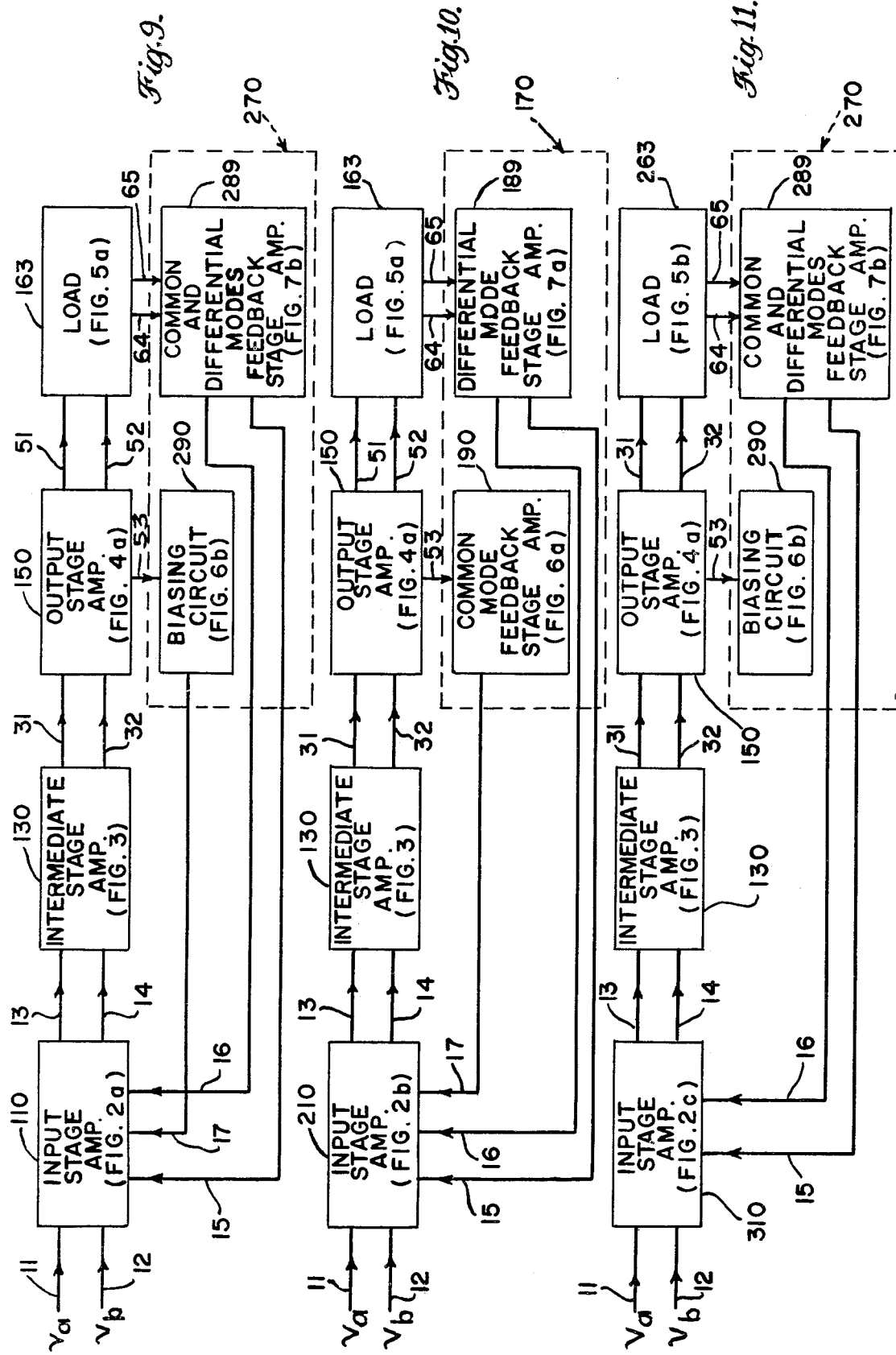

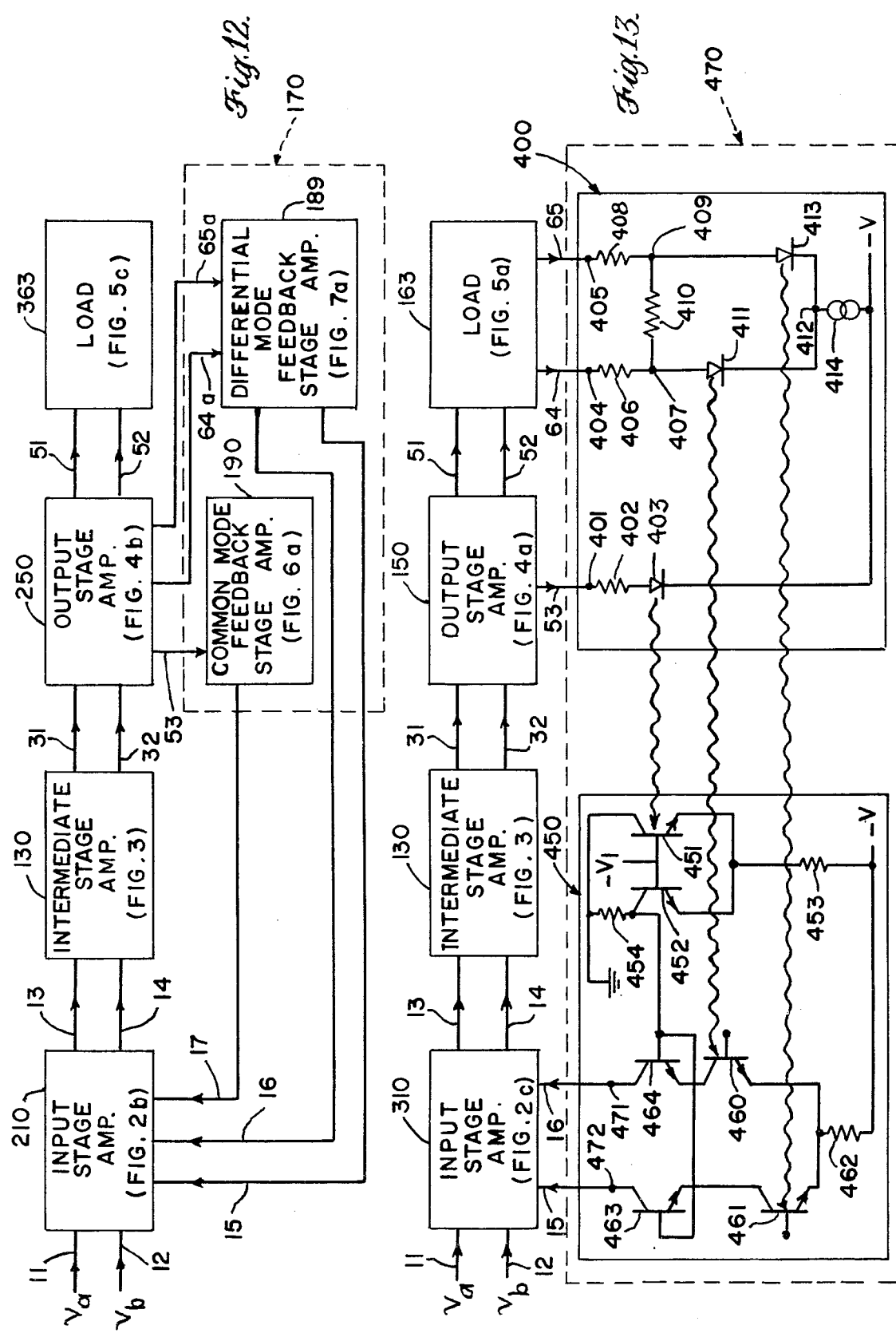

DIFFERENTIAL AMPLIFIER HAVING ACTIVE FEEDBACK CIRCUITRY

STATEMENT OF GOVERNMENT INTEREST

The invention described herein may be manufactured and used by or for the Government of the United States of America for governmental purposes without the payment of any royalties thereon or therefor.

CROSS-REFERENCES TO RELATED APPLICATIONS

This is a division of application Ser. No. 263,505 filed June 16, 1972, and now U.S. Pat. No. 3,845,404.

BACKGROUND OF THE INVENTION

The present invention generally relates to differential amplifier circuits and more particularly to feedback systems for controlling input and output stage amplifiers within the differential amplifier circuits.

Differential amplifiers are highly useful because of being able to handle a differential-mode signal in the presence of a common-mode signal without adverse effects to the differential-mode signal. For the case of a balanced amplifier the differential and common-mode signals are orthogonal. However, in most present day applications only the differential-mode is utilized and common-mode signal represents an undesired d.c. or a.c. voltage that is considered to be noise or interference. It is therefore desirable to suppress the common-mode signal in the amplifier to improve the signal-to-noise ratio of the desired signal.

Prior art devices such as those disclosed in two of the inventor's previous U.S. Pat. Nos. 3,262,066 and 3,638,132, teach the gain of the common-mode signal can be reduced by using active common-mode feedback techniques in combination with either active or non-active differential-mode feedback circuits.

A drawback to such systems is that if near perfect balance of the amplifier or other components cannot be maintained, undesirable differential-mode cross-coupled terms are generated in the amplifier by the common-mode signal. These cross-coupled terms then cannot be suppressed without suppressing the entire differential-mode signal.

SUMMARY OF THE INVENTION

Accordingly, it is a general purpose and object of the present invention to provide an improved differential amplifier. It is a further object to provide amplifier systems having either electrical or electro-optic feedback circuits for controlling the gain and input and output impedances of the amplifier. It is a further object to make specific components within the differential amplifier as general as possible so that a plurality of feedback systems may be associated with similar components. Additional objects are to prevent cross-coupling from effectively reducing the common-mode rejection ratio of a differential amplifier.

This is accomplished according to the present invention by providing a differential amplifier system having independent control of the signal gain of both common and differential-modes and the input and output impedances by use of active and opto-active feedback circuitry. Thus where it is desirable to suppress the common-mode signal, the amplifier is designed with optimum input and output impedance, gain and feedback circuitry, to suppress the common-mode signal at the input terminals and reduce the transfer of any common-mode signal at the output of the amplifier to the load. In other embodiments, the common-mode signal may be useful and thus it may be desirable to amplify both the common and differential-mode signals independently without common-mode suppression. In the above cases both electric and opto-electric feedback systems are utilized. In one embodiment a multichannel device is utilized in which a high frequency reference signal and a reference signal from a first channel are used to control and stabilize the gain of all the channels within the system.

BRIEF DESCRIPTION OF THE DRAWING

FIG. 1 is a generalized block diagram of a system according to the present invention;

FIGS. 2a, 2b and 2c are various embodiments of the input stage amplifier of FIG. 1;

FIG. 3 is an embodiment of the intermediate stage amplifier of FIG. 1;

FIGS. 4a and 4b are embodiments of the output stage amplifier of FIG. 1;

FIGS. 5a, 5b and 5c are various embodiments of the load of FIG. 1;

FIGS. 6a and 6b are parts of the feedback stage amplifier of FIG. 1;

FIGS. 7a and 7b are parts of the feedback stage amplifier of FIG. 1;

FIGS. 8–17, inclusive, are specific embodiments of the generalized block diagram of FIG. 1;

FIG. 18 shows a block diagram of an additional embodiment; and

DESCRIPTION OF THE PREFERRED EMBODIMENT

Figure 14:
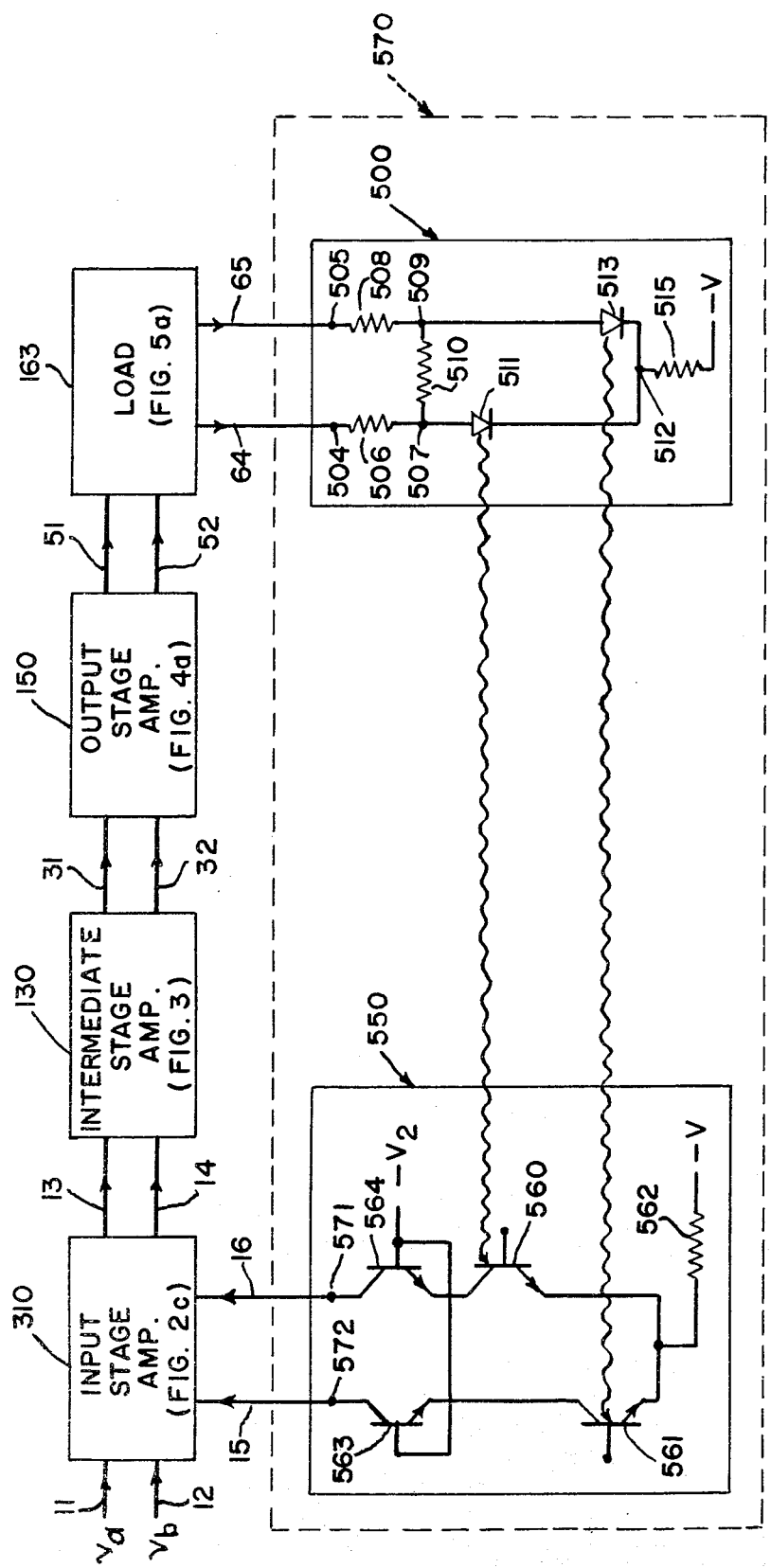

Referring now to the drawing and more particularly to FIG. 1 there is shown a generalized block diagram of a differential amplifier circuit that is useful in understanding the specific embodiments of the present invention as shown in the remaining FIGS.

More specifically an input stage amplifier 10 having a gain $|K| > 1$, receives an input signal $v_a - v_b$ on lines 11 and 12, respectively. The signal may comprise both common-mode and differential-mode signals. This is shown in the FIG. 1 in combinations of three arrows with the outside arrows indicating the phasing of differential-mode signals and the intermediate signal referring to the phasing of the common-mode signal. Where only two arrows are shown the phasing of differential-mode signals are shown and where one arrow is shown it refers to the phasing of a common-mode signal.

An intermediate stage amplifier 30 having a $|K| \geq 1$ receives signals from amplifier 10 over lines 13 and 14. The output of amplifier 30 is supplied to output stage amplifier 50 over lines 31 and 32. Output stage amplifier 50 having a $|K| > 1$ then supplies its output signal to load 63 on lines 51 and 52 and in addition can provide a common-mode feedback signal through line 53 to feedback stage amplifier 70.

The load 63 then provides differential-mode feedback signals over lines 64 and 65 to feedback amplifier 70.

Feedback stage amplifier 70 then provides common-mode feedback signals to input stage amplifier 10 over line 17 and differential-mode feedback signals are provided to input stage amplifier 10 over lines 15 and 16.

Alternatively, both common and differential-modes feedback signals may be provided over lines 15 and 16.

In operation an input signal containing both common-mode and differential-mode signals is supplied to input stage amplifier 10. The signal is amplified by amplifier 10 and then further amplified by intermediate stage amplifier 30. The output stage amplifier 50 then amplifies the signal and supplies a common-mode feedback signal over line 53 to feedback stage amplifier 70.

In many actual amplifier where the gain requirements are not severe the intermediate stage 30 may not be required. In such cases lines 13 and 14 can be connected directly to lines 31 and 32, respectively, provided the proper phasing for negative feedback for both common and differential-modes is maintained.

If one selects not to provide common-mode feedback signals through line 53, then both common and differential-modes feedback signals can be provided over lines 64 and 65.

In addition amplifier 50 provides an output signal to load 63 over lines 51 and 52. Differential-mode feedback signals are then applied to amplifier 70 over lines 64 and 65. The output of amplifier 70 is then applied to amplifier 10 over lines 15, 16 and 17. In this manner both common and differential-mode performance is improved by negative feedback providing more stability and control of input and output impedances of the system.

Although common-mode feedback signals may be received on all feedback lines in practice it will appear on either line 17 alone or on lines 15 and 16 with the differential-mode feedback depending on the particular embodiment and its common-mode impedance requirements. In general when the common-mode feedback is returned via line 17 the input impedance is increased for the common-mode input signal and when it is returned via lines 15 and 16 the common-mode input impedance can be increased or decreased compared to the impedance without feedback. Differential-mode feedback signals are returned only via lines 15 and 16 and can be used to increase or decrease the differential-mode input impedance depending on the requirements of the particular embodiment.

Referring now to FIG. 2a, there is shown a specific embodiment of the input stage amplifier 110. An input signal $v_a - v_b$ is supplied to terminals 111 and 112 over lines 11 and 12. Where connecting lines are identical to those shown in FIG. 1 they carry the same numerical notation.

The input signals are then applied to the respective bases of differentially coupled multi-emitter transistors 118 and 119. A +V bias supply is applied to the collectors of transistors 118 and 119 through respective resistors 120 and 121. A first set of emitters are connected to respective resistors 122 and 123 that have a common junction and are connected to terminal 117 for receipt of a common-mode feedback signal from line 17. A second set of emitters are connected directly to respective terminals 115 and 116 for receipt of either a differential-mode feedback signal or in some embodiments both common and differential-mode feedback signals from lines 15 and 16. The respective collectors of transistors 118 and 119 are connected to respective output terminals 113 and 114 for transmitting the output signal over lines 13 and 14.

When used in a system the amplifier 110 upon receipt of input signal $v_a - v_b$ amplifies the signal and supplies it to lines 13 and 14. This amplification is controlled by means of negative feedback signals supplied over lines 15, 16 and 17.

FIG. 2b shows a second embodiment of the input stage amplifier carrying the numerical notation 210. In this embodiment the input signal $v_a - v_b$ is applied to the bases of respective transistors 218 and 219 over lines 11 and 12 and terminals 211 and 212. The emitters of transistors 218 and 219 are tied together and connected to terminal 217 which receives a common-mode feedback signal over line 17 increasing the common-mode input impedance. The bases of transistors 218 and 219 are connected to respective terminals 216 and 215 for receipt of common and differential-mode feedback signals over lines 16 and 15. In this manner the feedback over lines 15 and 16 is shunt-connected to the input terminals thereby reducing the differential-mode or in some embodiments both differential and common-mode input impedance of the system. A +V bias supply is applied to respective collectors of transistors 218 and 219 through respective resistors 220 and 221. Output signals are supplied from the collector terminals of transistors 218 and 219 on respective terminals 213 and 214. The output signals are then supplied to lines 13 and 14. In operation the input signal $v_a - v_b$ is amplified and supplied to output lines 13 and 14. Negative feedback signals supplied over lines 15, 16, and 17 control the amount of amplification and the input impedance.

FIG. 2c shows a third embodiment 310 of the input stage amplifier. In this embodiment, the input signal $v_a - v_b$ is applied to respective transistors 318 and 319 through lines 11 and 12 and terminals 311 and 312. A +V bias voltage is supplied to the respective collector terminals of transistors 318 and 319 through respective transistors 320 and 321. Common-mode and differential-mode feedback signals are supplied to the emitters of transistors 318 and 319 through lines 15 and 16 and terminals 315 and 316. This feedback signal differs from that of the previous embodiments in that there is no separate common-mode feedback signal path and both common-mode and differential-mode feedback signals are independently coupled back via lines 15 and 16. The feedback signal is series connected to the emitters of transistors 318 and 319 and as a result results in a high input impedance for both common and differential-mode signals. The output of amplifier 310 is supplied from the collector terminals of transistors 318 and 319 to output lines 13 and 14 through terminals 313 and 314. In operation the input signal $v_a - v_b$ is amplified by the transistor circuitry with negative feedback over lines 15 and 16 controlling the amount of amplification. The output signal is then supplied to lines 13 and 14.

FIG. 3 shows an intermediate stage amplifier 130 receiving its input signals from the output of the previous stage over lines 13 and 14. The bases of respective transistors 135a and 136a receive the input signal through terminals 133 and 134 respectively. The emitters of transistors 135a and 136a are tied together through resistors 137 and 138. A +V bias voltage is supplied to the collector terminals of transistors 135b and 136b through resistors 139 and 140. A resistor 142 is connected between the +V voltage supply and a contact point common to both resistors 137 and 138. The emitters of transistors 135b and 136b are tied together and connected through a resistor 141 to ground. The collectors of transistors 135a and 136a are respectively connected to the bases of 135b and 136b. The output is supplied from the collector terminals of transistors 135b and 136b to lines 31 and 32 through terminals 131 and 132. In operation the input signal that is supplied over lines 13 and 14 is amplified and supplied to the output lines 31 and 32.

Referring now to FIG. 4a, there is shown an output stage amplifier 150 receiving its input signal on lines 31 and 32 to terminals 153 and 154. The signal is then applied to transistor pairs 155a and b, respectively. A +V bias signal is supplied to a junction connecting transistor emitters 155b and 156b through a resistor 162. A resistor 157a connects the +V voltage bias to the base of transistor 155b and the collector of transistor 155a. A resistor 158a connects the +V bias voltage to the base of transistor 156b and the collector of transistor 156a. A resistor 157b connects the collector of transistor 155b to common-mode feedback terminal 161. Resistor 158b connects the collector of transistor 156b to terminal 161. The emitters of transistors 155a and 156a are also connected to terminal 161. Terminal 161 provides a common-mode feedback signal via line 53. The output signal of amplifier 150 is supplied from the respective collectors of transistors 155b and 156b via lines 51 and 52 through terminals 151 and 152. In operation an input signal supplied via lines 31 and 32 is amplified and sent through to lines 51 and 52. Since line 53 is series connected to amplifier 150, the impedance seen by the common-mode feedback signal is increased.

FIG. 4b shows an output stage amplifier 250 receiving its input signal over lines 31 and 32 and applies it to transistors 255 and 256 through terminals 253 and 254. A +V bias supply is connected to the collectors of transistors 255 and 256 through resistors 257a and 258a. The emitters of transistors of 255 and 256 are connected to a common junction through resistors 257b and 258b, respectively. The common junction is connected to terminal 261. Line 53 is connected to terminal 261 for providing a common-mode feedback signal. The emitters of transistors 255 and 256 are also connected to respective feedback lines 65 and 64 through terminals 265 and 264. The collectors of transistors 255 and 256 supply an output signal to respective lines 51 and 52 through terminals 259 and 260.

In operation, the input signal received on lines 31 and 32 is amplified within amplifier 250 and supplied to output lines 51 and 52. In addition a common-mode feedback signal is supplied to line 53 and a signal supplied to lines 64 and 65 comprises a differential-mode feedback signal and a common-mode signal which is usually suppressed in the feedback amplifier.

FIG. 5a shows a simple load circuit receiving a signal across a resistor 166 from lines 51 and 52 and providing both common and differential-mode shunt feedback signals through lines 64 and 65. In such an arrangement the feedback signal will be utilized as only a differential-mode signal if the previous stage has already supplied a common-mode signal to improve the common-mode rejection ratio. Since the feedback signal is shunt connected to the load, the output impedance is reduced.

In FIG. 5b a load circuit 263 comprises a first resistor 266a and a second resistor 266b with a terminal 269 at an intermediate junction thereof. Outer terminals of the respective resistors 266a and 266b are terminals 267 and 268 respectively. These terminals 267 and 268 receive the input signal on lines 51 and 52 and supply a feedback signal comprised of both common and differential-mode signals to lines 64 and 65 connected respectively to terminals 268 and 269. The feedback signal is series connected to raise the output impedance of the load. This is an alternate form of series connection to that shown in FIG. 4b.

In FIG. 5c load circuit 363 comprises a resistor 366 connected to terminals 367 and 368 for a receipt of a signal from lines 51 and 52.

FIG. 6a shows a common-mode feedback amplifier 190 having a terminal 191 receiving a common-mode feedback signal on line 53. Amplifier 190 comprises part of amplifier 70 of FIG. 1. A resistor 193 is connected intermediate terminal 191 and the base of transistor 192. A resistor 194 and diode 195 are connected between the base of transistor 192 in a −V bias voltage. Resistor 194 and diode 195 function to provide a forward bias for transistor 192 and with resistor 193 determine the common-mode closed loop gain of the system. In addition a biasing resistor is connected between the −V bias voltage and the emitter of transistor 192. A terminal 197 is provided to connect the collector of transistor 192 to output line 17 for providing a common-mode feedback signal to whichever input stage amplifier is selected. In operation a signal received from line 53 is used to control a current isolation device comprising transistor 192, diode 195, and resistors 193, 194 and 196. The output of feedback source 190 appears on line 16 as the common-mode feedback signal.

FIG. 6b shows a biasing circuit 290 comprising a line 53, resistor 293 and bias supply −V for the emitter circuit of FIGS. 4a and b when no separate common-mode feedback point is utilized. A current generator 295 is connected between the −V bias supply and line 17.

Referring now to FIG. 7a there is shown a differential-mode feedback stage amplifier 189. Amplifier 189 comprises part of feedback stage amplifier 70 of FIG. 1 in some embodiments. A signal is supplied to amplifier 189 from lines 64 and 65 to terminals 171 and 172. A voltage divider terminal 178 is formed between terminals 172 and a −V bias voltage. The terminal 172 is serially connected to a resistor 175, terminal 178, resistor 176 and the −V bias supply. The terminal 171 is connected serially to resistor 173, terminal 177, resistor 174 and the −V bias supply. The terminal 177 is the intermediate terminal on this second voltage divider circuit. The −V voltage supply in addition is connected to a current generator 184 which is connected to the emitters of respective transistors 179 and 180 through respective resistors 185 and 186. The base of transistor 179 is connected directly to terminal 177 and the base of transistor 180 is connected directly to terminal 178. The collectors of transistors 179 and 180 are connected to respective output lines 16 and 15 through respective terminals 181 and 182.

In operation the signal supplied by lines 64 and 65 containing both differential and common-mode components is divided by the voltage divider made of the resistor-pairs 173, 174 and 175, 176 which attentuate the differential-mode signal feedback and thus determine the differential-mode gain of the whole amplifier system. The output of the voltage divider appears across terminals 177 and 178 which are connected to a differentially connected current isolation device made up of transistors 179, 180; resistors 185, 186; and current source or sink 184. Current source 184 removes the common-mode signal present on terminals 177 and 178 from the output terminals 181 and 182. Embodiments using this configuration will have the common-mode signal feedback via a separate common-mode feedback stage. Thus the output of the current isolation device containing only differential-mode feedback appears at terminals 181 and 182 for connection to the input stage by lines 16 and 15.

FIG. 7b shows a common and differential-mode feedback stage amplifier 289 receiving feedback signals on terminals 271 and 272 from lines 64 and 65, respectively. Amplifier 289 comprises part of feedback stage amplifier 70 of FIG. 1 in some embodiments. Terminal 272 is connected to the −V bias supply through resistor 275, voltage divider terminal 278 and resistor 276. Terminal 271 is connected to the −V bias supply through resistor 273, voltage divider terminal 277 and resistor 274. Terminal 277 is connected directly to the base of a transistor 279 and terminal 278 is connected directly to the base of transistor 280. A resistor 287 is connected intermediate the bases of respective transistors 279 and 280. In addition the −V bias voltage is connected to the emitters of transistors 279 and 280 through resistor 283 that is connected in series with both respective resistors 285 and 286. The collectors of transistors 279 and 280 are connected to output lines 15 and 16 through terminals 282 and 281.

In operation the signal supplied from lines 64 and 65 is attenuated by voltage dividers made up of resistor-pairs 273, 274 and 275, 276 which attenuate both the common-mode and the differential-mode feedback signals from lines 64 and 65. The output of the voltage divider at terminals 277 and 278 is connected to a differentially connected current isolation device made up of transistors 279, 280; and resistors 285, 286, 287, and 283. Resistors 285 and 286 keep the output impedance of the current isolation device high and resistor 287 in combination with the voltage divider determines the differential-mode gain of the whole amplifier system. Similarly resistor 283 in combination with the voltage divider determines the common-mode gain of the whole amplifier system independently of the differential-mode gain. The output of the current isolation device containing both the differential-mode and common-mode feedback signals appears at terminals 281 and 282 for connection to the input stage by lines 15 and 16.

In the blocks shown by FIGS. 2 through 7 the transistor stages may be replaced by other combinations of transistors or the transistors in some cases may be replaced by complete amplifiers such as operational or linear amplifier integrated circuits as long as the connections of these devices are treated as three terminal active devices with gain such as transistors.

Referring now to FIG. 8 a first specific embodiment is shown. An input signal $v_a - v_b$ is supplied to input lines 11 and 12, respectively, of input stage amplifier 110. The signal is then amplified and supplied to an intermediate stage amplifier 130 through lines 13 and 14 and then to output stage amplifier 150 via lines 31 and 32. A common-mode feedback signal is then supplied to common-mode feedback stage amplifier 190. Part of the feedback circuit 170, on line 53 and the output of amplifier 190 is supplied back to input stage amplifier via line 17. The output of amplifier 150 is supplied to load 163 on lines 51 and 52 and fed back to the input stage amplifier 110 on lines 64 and 65 through differential-mode feedback stage amplifier 189 and then on lines 15 and 16 to input stage amplifier stage 110.

In operation the device of FIG. 8 provides a series-shunt feedback system for differential-mode signals and series-series feedback system for the common-mode signals. By series-shunt is meant the input impedance is series connected to the feedback system, thereby increasing the input impedance and the output impedance is shunt connected to the feedback system, thereby lowering the output impedance. This hyphenated notation will be used throughout the specification.

Referring now to FIG. 9 there is shown an embodiment in which the input signal $v_{at} - v_b$ is supplied through input stage amplifier 110, intermediate stage amplifier 130 and output stage amplifier 150 to load 163. Lines 64 and 65 are connected across the output terminal of load 163 for feeding back a common and differential-mode feedback signal through amplifier 289 to input stage 110 on lines 15 and 16. In addition, a current generator 290 is provided for supplying a signal to input stage amplifier 110 to provide for additional current biasing of the input stage. However the bias could also be obtained through lines 15 and 16 with terminal 17 left open. In this device both common-mode and differential-mode signals applied to input stage amplifier 110 are serially connected to provide a high input impedance and the feedback signals taken from load 163 are shunt connected in both the common and differential-modes to provide a lower output impedance for load 163. Therefore, the feedback system is series-shunt connected for both common and differential-modes signals.

Referring now to FIG. 10 there is shown a differential amplifier having an input stage amplifier 210, intermediate stage amplifier 130, output stage amplifier 150, load 163, common-mode feedback stage 190 connected between amplifier 150 and 210 and common and differential-modes feedback stage amplifier 189 connected between load 163 and amplifier 210. In this system the common-mode feedback amplifier 190 is serially connected to both amplifiers 150 and 210 resulting in both higher input and output impedances. Amplifier 189 is shunt-connected to both load 163 and amplifier 210 which would result in lowering both the input and output impedances. The common-mode feedback system is therefore series-series connected and the differential-mode feedback system is shunt-shunt connected.

Referring now to FIG. 11 there is shown amplifiers 310, 130 and 150 connected to load 263. Feedback amplifier 289 connects load 263 to amplifier 310. In this system since only one feedback amplifier 289 is used, both common and differential-mode feedback signals are carried through this amplifier 289. Both input stage amplifier 310 and load 263 are serially connected to amplifier 289 resulting in high impedances for both modes of operation at both the input and output of the system.

FIG. 12 has amplifiers 210, 130 and 250 connected to a load 363. A common-mode feedback signal is supplied through amplifier 190 to amplifier 210 and differential-mode signals are supplied through amplifier 189 to amplifier 210. The common-mode feedback stage amplifier is serially connected to both amplifier 210 and 250 thereby increasing both input and output impedance for the common-mode signal. Amplifier 189 is shunt-connected to amplifier 210 and series-connected to amplifier 250 resulting in a lower impedance to the differential-mode signal in the input stage and higher impedance in the output stage.

Several alternate embodiments (not shown) could also be utilzied. A first configuration would use amplifier 289 of FIG. 7b and amplifier 290 of FIG. 6b to provide both modes of feedback resulting in the same shunt-series configuration. A second configuration of importance is the common-mode shunt-shunt, differential-mode shunt-shunt case which is similar to that of FIG. 10 with feedback amplifier 170 consisting of feedback amplifier 289 of FIG. 7b instead of amplifier 179 and biasing circuit 290 of FIG. 6b instead of feedback amplifier 190. A third of importance is the common-mode shunt-shunt, differential-mode series-shunt case which is similar to that of FIG. 11 with the biasing circuit 290 of FIG. 6a connected with their input terminals 191 in a common junction with line 53 and there collectors each connected to one of the input terminals 311 and 312 of input stage 310. In this case it is also necessary to rephase the common-mode feedback output signal on line 53. This may be accomplished in a plurality of ways well established in the art.

The remaining FIGS. 13–19, inclusive, represent improvement in the state of the art for d.c. differential amplifiers by utilizing optical coupling with active feedback. Some of the advantages of these in comparison to the straight active feedback are: complete isolation between the input and output circuit (infinite impedance); much less capacitance allowing much higher frequency response; wide physical separation between the input and output circuits; similar input stages (less active elements); multiple feedback loops without interaction; additive mixing of feedback signals; adaptive feedback systems; and multiple channel cross-coupled feedback stabilization systems. An additional advantage to these circuits may be separated where necessary by considerable distance using fiber-optics or other means to complete the optical coupling.

Referring now to FIG. 13 there is shown a specific embodiment utilizing electro-optic feedback circuits. FIG. 13 differs from the generalized block diagram of FIG. 1 in that the feedback network 470 is comprised of a light-emitting circuit 400 and a light-detecting circuit 450.

An input signal $v_a - v_b$ is applied to input stage amplifier 310 via lines 11 and 12. The output of amplifier 310 is applied to intermediate stage amplifier 130 over lines 13 and 14 with the output of amplifier 130 applied to output stage amplifier 150 over lines 31 and 32. Amplifier 150 supplies its output over lines 51 and 52 to load 163 and a common-mode feedback signal to terminal 401 of circuit 400 over line 53. Terminal 401 is connected to a −V bias supply through a resistor 402 and a light-emitting diode 403. Other sources of light such as lasers (not shown) can be used in place of LED's.

A combined common and differential-mode feedback signal is supplied to terminals 404 and 405 over respective lines 64 and 65. Terminal 404 is connected to a resistor 406 that has a terminal 407 connected thereto. Terminal 405 is connected to resistor 408 that has a terminal 409 connected thereto. A resistor 410 is connected between terminals 407 and 409. LED 411 is connected between terminal 407 and a terminal 412. LED 413 is connected between terminal 409 and terminal 412. A current generator 414 is connected between terminal 412 and the −V bias supply.

Detecting circuit 450 has a transistor 451 with its photo junction optically connected to receive the light radiation from LED 403. Transistor 451 is shown as a phototransistor but a photofet, photodiode transistor combination or other light-detecting device could be used at the option of the system designer. The emitter of phototransistor 451 is connected to the emitter of transistor 452 with both emitters of transistors 451 and 452 connected to a −V bias supply through a resistor 453. A resistor 454 is connected between the collectors of respective transistors 451 and 452 and the collector of phototransistor 451 is grounded. A $-V_1$ voltage supply is applied to the bases of both transistors 451 and 452.

Phototransistors 460 and 461 have their light-sensitive areas optically connected to LED's 411 and 413, respectively, for receipt of light-emitting rays. The emitters of phototransistors 460 and 461 are tied together and connected to the −V bias supply through a resistor 462. A pair of transistors 463 and 464 have their emitters connected to the respective collectors of phototransistors 461 and 460. The base electrodes of both transistors 463 and 464 are tied together and connected to the collector electrode of transistor 452 for receipt of the common-mode feedback signal. The collectors of transistors 453 and 464 are connected to respective terminals 472 and 471. Lines 15 and 16 then connect respective terminals 472 and 471 to input stage amplifier 310.

The operation of components 310, 130, 150 and 163 is similar to that previously described. In emitting circuit 400, the LED 403 upon receipt of the common-mode feedback signal from line 53 emits light radiation which is received by phototransistors 451 and the signal is then amplfied and fed back to input stage amplifier 310 over lines 15 and 16. Resistor 402 controls the common-mode gain of the system. The differential-mode feedback signal from lines 64 and 65 is applied to respective LED's 411 and 413 from which light is emitted to phototransistors 460 and 461, respectively. The common-mode signal is removed from the LED's 411 and 413 by the current source 414 which completely degenerates the common-mode feedback signal. Resistors 406, 408 and 410 control the differential gain of this differential-mode signal. The signal is then amplified and sent back to input stage amplifier 310 over lines 15 and 16. The common-mode feedback system is series-series connected and the differential-mode feedback system is series-shunt connected.

In FIG. 14 components 310, 130, 150 and 163 are connected together and operate in the manner described for FIG. 13. In the feedback network of FIG. 14 lines 64 and 65 supply the common and differential-mode feedback to emitting circuit 500 which receives the signal upon terminals 504 and 505, respectively. Resistor 506 is connected to terminal 504 and a terminal 507. A resistor 508 is connected to terminal 505 and a terminal 509. A resistor 510 is connected between terminals 507 and 509. LED 511 has its anode connected to terminal 507 and its cathode connected to terminal 512. LED 513 has its anode connected to terminal 509 and its cathode connected to terminal 512. A resistor 515 connects terminal 512 to a −V bias voltage. The light rays emitted from LED's 511 and 513 are received by detecting and amplifying circuits 550 at the light sensitive areas of phototransistors 560 and 561, respectively. The emitters of phototransistors 560 and 561 are connected together and further connected to a −V bias voltage through a resistor 562. The collectors of phototransistors 560 and 561 are connected to the emitters of respective transistors 564 and 563. The base electrodes of transistors 563 and 564 are connected together and to intermediate bias supply −$V_2$. The collectors of transistors 563 and 564 are then connected to input stage amplifier 310 through terminals 570 and 571 in lines 15 and 16, respectively.

In operation LED's 511 and 513 receive common and differential-mode feedback signals via lines 64 and 65 and emit light rays that are detected by phototransistors 560 and 561. Resistors 506, 508 and 510 control the differential-mode gain and resistors 506, 508 and 515 control the common-mode gain of the system. The optical signals are then amplified and applied to input stage amplifier 310 via lines 15 and 16. In this manner the output is shunt connected for lowering the output impedance of both the differential and common-mode signals and the input is series connected for raising the impedance of both the common-mode and differential-mode signals at amplifier 310. The system supplying both common and differential-modes feedback is series-shunt connected.

Figure 15:
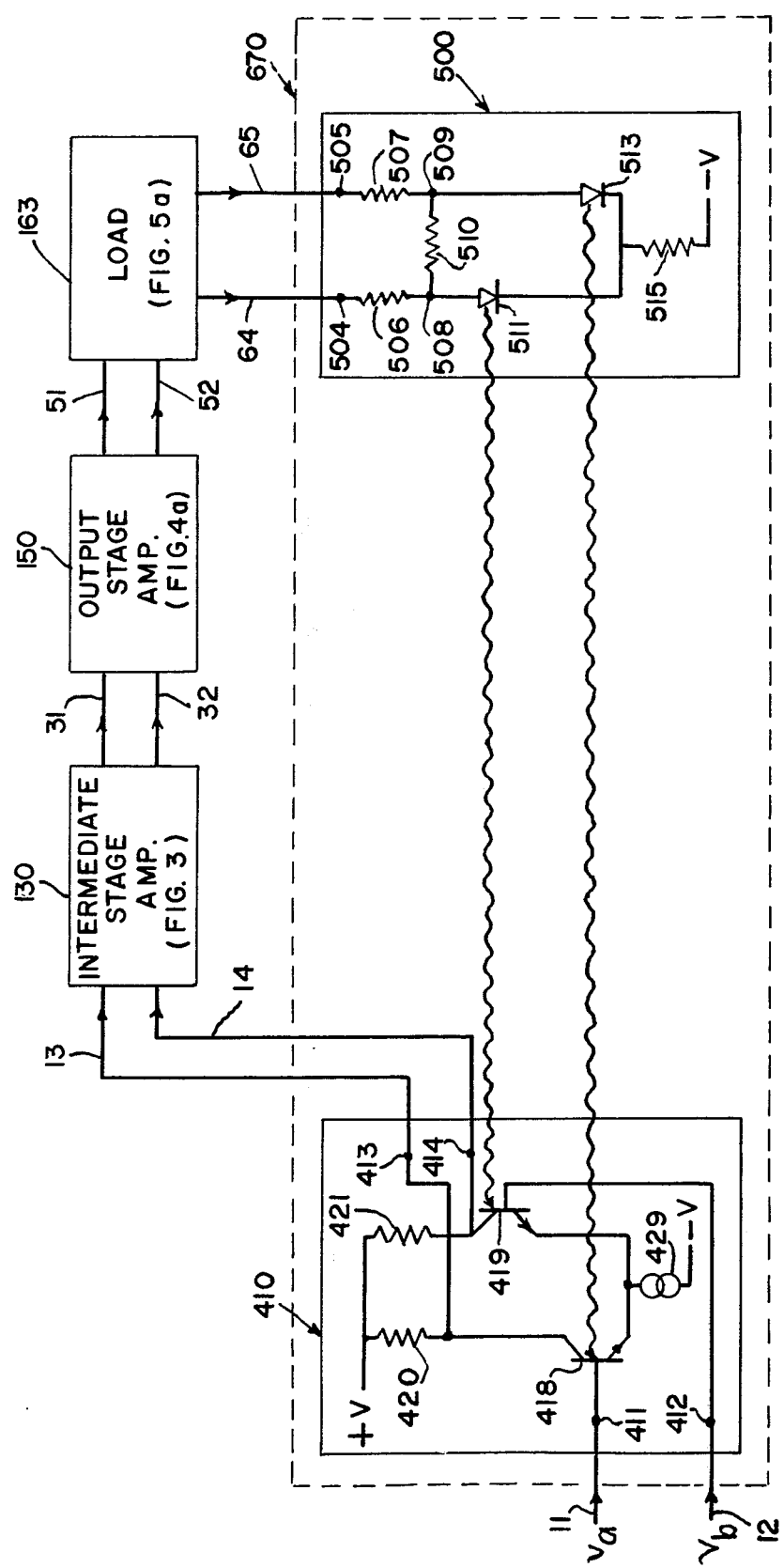

Referring now to FIG. 15 an electrically and optically coupled input stage amplifier 410 is utilized. The input signal $v_a - v_b$ is supplied to the bases of phototransistors 418 and 419 via respective lines 11 and 12, and input terminals 411 and 412. A +v bias voltage is supplied to the respective collectors of phototransistors 418 and 419 through resistors 420 and 421, respectively. The emitters of phototransistors 418 and 419 are connected together and further connected to a −V bias voltage through a current generator 429. The output of amplifier 410 is taken from the collectors of phototransistors 418 and 419 and applied to terminals 413 and 414 which are in turn respectively connected to lines 13 and 14 for transmitting the signal to intermediate stage amplifier 130. Components 130, 150 and 163 are connected and operate in a manner previously described. It is to be noted in this embodiment the common-mode feedback terminal of amplifier 150 is not utilized. The emitting circuit of FIG. 15 is the same as that in FIG. 14, therefore the same numerical notation is used. The light rays from LED's 511 and 513 in FIG. 15 are received via input stage amplifier 410 at phototransistors 418 and 419 for controlling this amplification stage.

The feedback system is shunt connected to the load 163 so that output impedance of the load is lower in both the common and differential-modes. Additionally, the optical detection taking place on the base-emitter diodes of phototransistors 418 and 419 shunt couple the feedback to the input amplifier 410 so that the impedance of amplifier 410 is lowered in both the common and differential-modes.

Figure 16:
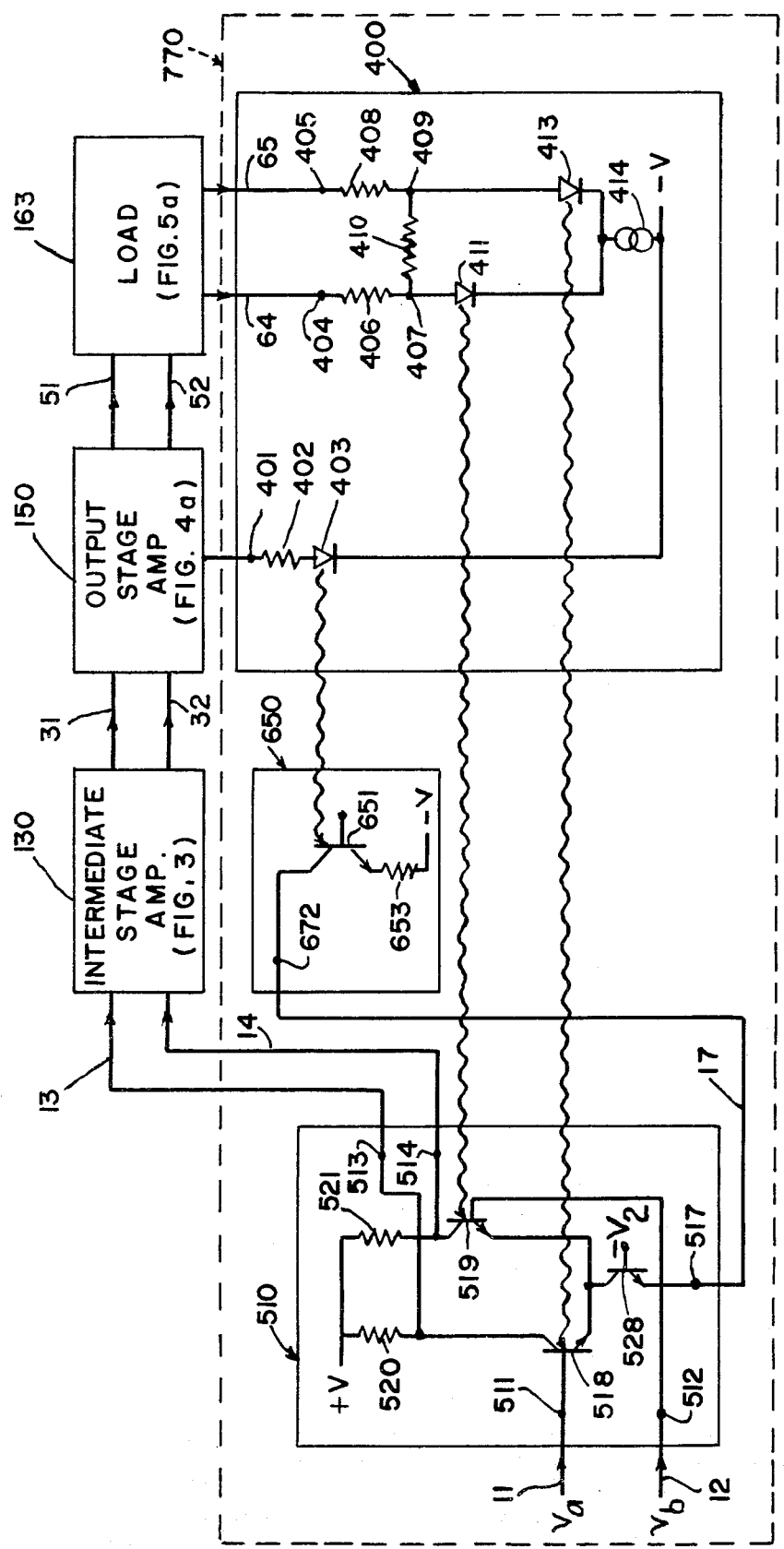

Referring now to FIG. 16 there is shown an input stage amplifier 510 receiving an input signal $v_a - v_b$ at terminals 511 and 512 over respective lines 11 and 12. A pair of phototransistors 518 and 519 have their base electrodes connected to respective terminals 511 and 512 for receipt of the input signal. A +V voltage supply is connected to phototransistors 518 and 519 through respective resistors 520 and 521. The emitters of phototransistors 518 and 519 are connected together and are further connected to the collector electrode of transistor 528. Transistor 528 has its base electrode connected to a −$V_2$ bias supply and its emitter connected to terminal 517 for receipt of a common-mode feedback signal over line 17. The ouput of amplifier 510 is taken from the collectors of phototransistors 518 and 519 and applied to terminals 513 and 514, respectively. The output signal is then transmitted to intermediate stage amplifier 130 over lines 13 and 14. Components 150, 163 and 400 are then connected the same as in FIG. 13. Detecting and amplifying circuit 650 receives the light emitting rays of LED 403 at phototransistors 651. The emitter of phototransistor 651 is connected to a −V bias supply through resistor 653. The collector of phototransistor 651 is connected to a terminal 672 that is, in turn, connected to line 17 for transmission of the common-mode electrical feedback signal to amplifier 510. In operation the differential-mode feedback signal from LED's 411 and 413 are detected in amplifier 510 by phototransistors 518 and 519. The light ray from LED 403 is detected by phototransistor 651 that, in turn, has its electrical common-mode feedback signal supplied over line 17 to amplifier 510. The common-mode feedback circuit is connected serially at both input stage amplifier 510 and output stage amplifier 150 so that the impedance as seen by the common-mode signal is raised. The differential-mode feedback system is shunt-shunt connected to lower both input and output impedances.

Figures 17, 18:
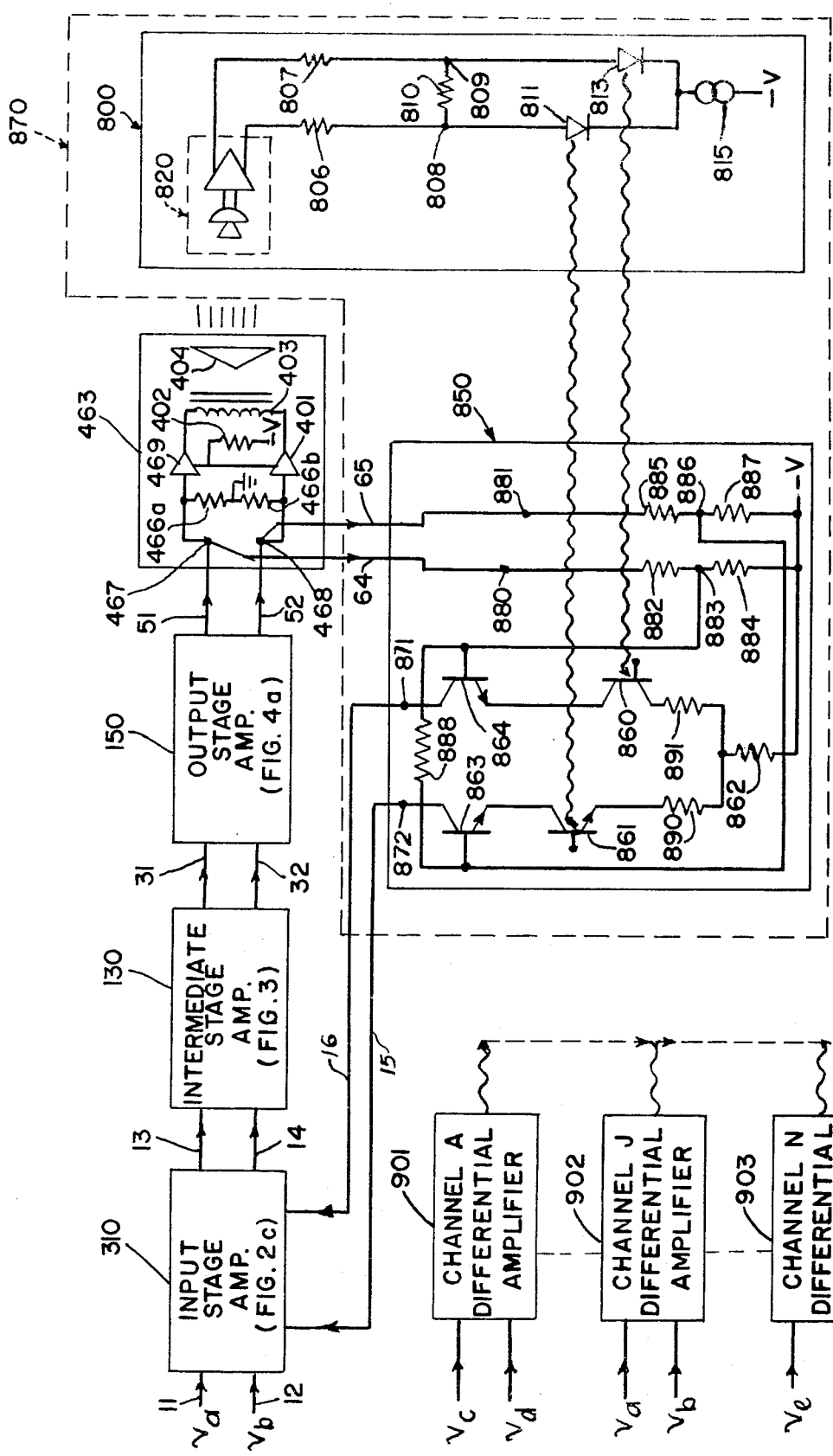

Referring now to FIG. 17 there is shown amplifiers 310, 130 and 150 connected to receive input signal $v_a - v_b$. A load circuit 463 receives its input signal from amplifier 150 over lines 51 and 52. Input terminals 467 and 468 receive the input signal and have connected between them resistors 466a and 466b having a terminal connected therebetween and grounded. Amplifiers 469 and 401 are also connected to respective input terminals 467 and 468. A −V bias supply is connected to both amplifiers 401 and 469 through a resistor 402. The outputs of amplifiers 401 and 469 are connected to a loudspeaker 404 having a coil 403 driving a speaker 404. A first common and differential-modes feedback signal is supplied from terminals 467 and 468 over lines 64 and 65 to terminals 880 and 881 of detecting and amplifying circuit 850. Terminal 880 is connected to a −V voltage bias through a voltage divider circuit comprising resistor 882, voltage divider terminal 883 and resistor 884. Terminal 881 is connected to the −V bias supply through a voltage divider circuit comprising resistor 885, voltage divider terminal 886 and resistor 887. Terminal 883 is then connected to the base of transistor 864 and terminal 886 is connected to the base of transistor 863. The bases of the two transistors are connected with a resistor 888 therebetween.

A second common and differential-modes feedback circuit is formed by supplying the acoustic output of the speaker 404 being coupled to a microphone 820 of emitting circuit 800. The output signal of the amplifier of microphone 820 is connected through respective resistors 806, 807, two terminals 808 and 809 with a resistor 810 therebetween. LED's 811 and 813 have their anodes to respective terminals 808 and 809 and their cathodes connected together. A −V supply voltage is connected to the cathodes of LED's 811 and 813 through a constant current generator 815. The rays of LED's 811 and 813 are then transmitted to phototransistors 860 and 861, respectively, of circuit 850. A −V supply voltage is connected to the emitters of phototransistors 860 and 861 through a resistor 862 and respective resistors 890 and 891. The collectors of transistors 860 and 861 are respectively connected to the emitters of transistors 864 and 863. The collectors of transistors 863 and 864 are then connected to terminals 872 and 871 where the feedback signal is applied to input stage amplifier 310 over lines 15 and 16.

In operation the device of FIG. 17 provides a first common and differential-mode feedback loop from terminals 467 and 468 of load 463. The feedback signal is supplied to the bases of transistors 863 and 864 from voltage divider terminals 883 and 886 of circuit 850. In addition, a second feedback is supplied by differential microphone 820 that senses the acoustic output from speaker 404 at some point in the room and supplies a differential-mode signal to LED's 811 and 813. The light rays from diodes 811 and 813 are supplied to phototransistors 860 and 861 which are connected to the emitters of transistors 863 and 864 to provide control. The output of transistors 863 and 864 which are controlled from both feedback loops are then supplied to input stage amplifier 310 through terminals 470 and 471 over lines 15 and 16. Thus the two feedback loops control the gain of the amplifier, one controlling the stability of the main amplifier, the other compensating for changes in the room characteristics. Because of this optical-active coupling there is no feed forward of the type that takes place with passive feedback elements and the feedback circuits operate without loading each other. The embodiment shown herein as an example of a multi-loop feedback system was shown as an acoustical system however the technique is general and can be applied to any system where the load is some form of transducer. Other applicable systems include temperature compensation systems, cathode-ray tube intensity compensation systems, laser stabilization systems and many others.

Figure 19:
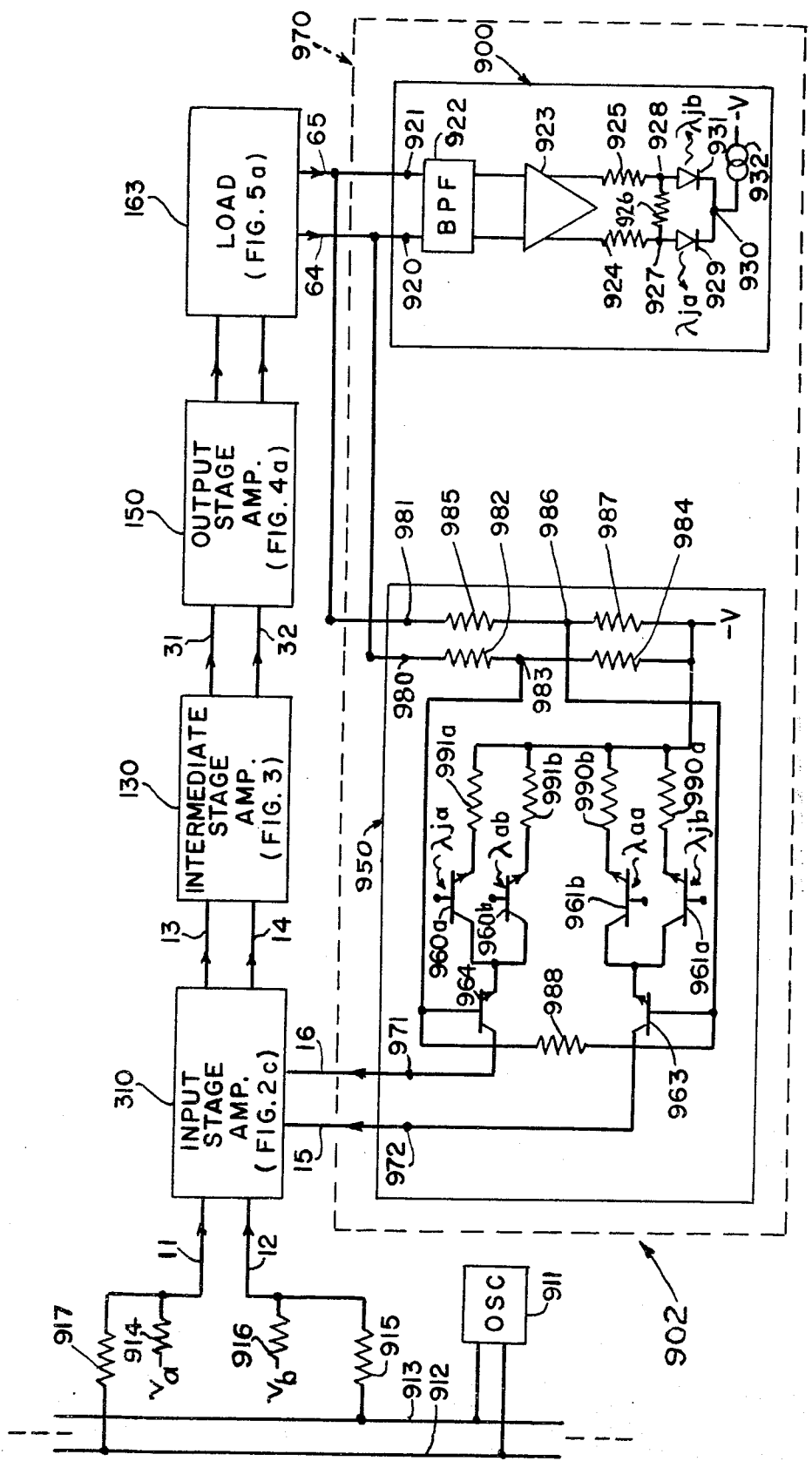
FIG. 19 shows a channel within the system of FIG. 18.

FIG. 18 shows the differential amplifiers in a multichannel system. Three of the amplifiers are shown. They are the first channel amplifier A 901; the Jth channel amplifier 902 representing any typical intermediate channel; and the Nth channel amplifier 903 representing the last channel. The first channel A differential amplifier 901 receives input signals $v_c - v_d$. Channel J differential amplifier 902 receives input signal $v_a - v_b$ and channel N differential amplifier 903 receives input signal $v_e - v_f$. In this system the wavy lines are used to show light ray emission from LED's (not shown) within the channel A differential amplifier 901 that are emitted and detected by both amplifiers 902 and 903 so that the gains of all channels remain equal to each other at all times. A specific embodiment of channel J differential amplifier 902 is shown in FIG. 19 and is used to describe this embodiment of the invention. Fiber optic elements may be used for transmitting the light rays.

A reference oscillator 911 supplies a constant frequency $f_o$ to lines 912 and 913 which are connected to all N channels of the system. Input stage amplifier 310 is connected to line 912 through resistor 917 and line 11. Amplifier 310 is connected to line 913 through resistor 915 and line 12. Input signal $v_a - v_b$ is also supplied to amplifier 310 through respective lines 11 and 12 and resistor 914 and 916. Amplifiers 310, 130 and 150, as well as load 163, have been previously described and will not be further described at this time with the exception that is to be noted that in this case the frequency signal $f_o$ has also been amplified and applied to load 163. The feedback signal is supplied to lines 64 and 65 for transmission to both emitting circuit 900 and detecting and amplifying circuit 950. The frequency $f_o$ from the frequency oscillator 911 is just above the highest frequency of the input signals. The signal on lines 64 and 65 is supplied to terminals 920 and 921 and bandpass filter 922 passes only the $f_o$ signal to differential amplifier 923. The output of differential amplifier 923 is supplied to resistors 924 and 925 connected to respective terminals 927 and 928 with a resistor 926 connected therebetween. An LED 929 has its anode connected to terminal 927 and its cathode connected to terminal 930. An LED 931 has its anode connected to terminal 928 and its cathode connected to terminal 930. A $-V$ bias supply is connected to terminal 930 through current source 932.

Lines 64 and 65 additionally supply a signal to feedback circuit 950 with terminals 980 and 981 receiving the feedback signals. The voltage divider circuit is then provided to that of FIG. 17 and comprises components 982–987, inclusive. The signals from terminals 983 and 986 are supplied to the bases of respective transistors 963 and 964. These base electrodes have a resistor 988 connected there between. A $-V$ supply voltage is supplied to respective phototransistors 960a, 960b, 961a and 961b through respective resistors 891a, 891b, 890b and 890a. The collectors of both phototransistors 860a and 860b are connected to the emitter of transistor 864. The collectors of phototransistors 861a and 861b are connected to the emitter of transistor 863. The feedback signal is then supplied from the collectors of transistors 863 and 864 to terminals 870 and 871 over lines 15 and 16 to input stage amplifier 810.

The operation of the device will now be described with reference to FIGS. 18 and 19. Input signal $v_a - v_b$ is applied to channel 902 of a multichannel system. The signal is amplified to channel 902 of a multichannel system. The signal is amplified and applied to load 163 and common and differential-modes feedback signals are supplied via lines 64 and 65. A first loop is supplied to the bases of transistors 963 and 964 via voltage divider terminals 986 and 983, respectively. The signal on lines 64 and 65 is also processed through bandpass filter 922 which eliminates all but the $f_o$ frequency. This signal is amplified and supplied to LED's 929 and 931. The light rays from LED's 929 and 931 are supplied to phototransistors 960a and 961a, respectively. In addition, further control of circuit 950 takes place by receipt of light rays at phototransistors 960b and 961b, respectively, from LED's within channel A (not shown). The output signal of circuit 950 is then supplied to input stage amplifier 310 via lines 15 and 16 for controlling the amplification of the system. In this manner all gains and levels within the system are equal to each other at all times. This is due to proper phasing of channels A 901 and J 902, so if the gain from channel A 901 increases it will increase the gain of channel J 902 and other channels a similar amount.

Channel A 901 is basically the same as channel J 902 shown in FIG. 19 except that phototransistors 960b and 961b are not required since there is no cross-coupled signal for channel A. Oscillator 911 would not be needed if the incoming signal comprised the $f_o$ reference signal. Furthermore, the reference feedback loop could receive its signal prior to load 163.

It has therefore been shown means for controlling the active feedback circuitry within a differential amplifier system. By interchanging specific components one may control both differential and common-modes impedances at both the input and output of the device separately. The common and differential-modes are orthogonal to each other and the gains and impedances are independent of each other if the amplifiers are balanced. There has also been described electro-optic coupling in the feedback system by which many advantages not obtainable by coupling with electric wires can be achieved.

It will be understood that various changes in the details, materials, steps and arrangements of parts, which have been herein described and illustrated in order to explain the nature of the invention, may be made by those skilled in the art within the principle and scope of the invention as expressed in the appended claims.

What is claimed is:

1. A differential amplifier system comprising:
    input circuit means adapted to receive an input signal having common mode and differential mode components, and connected to receive common and differential mode feedback signals, and for supplying a first output signal;
    output circuit means connected to receive and amplify said first output signal and for providing an output signal having both common mode and differential mode components;
    load means having a transducer connected to receive said output circuit means output signal and for providing an output signal having an energy content indicative of said output circuit means output signal;
    energy detecting active feedback means for receiving said transducer output signal and for providing an optical output signal indicative of only the differential mode component of said transducer output signal; and
    light detecting active feedback means connected to receive said output circuit means output signal and the optical output signal for providing the common and differential mode feedback signals to said input circuit means;
    whereby a first feedback loop said light detecting active feedback means and a second feedback loop comprises said load means, said energy detecting active feedback means and said light detecting feedback means.

2. A differential amplifier system according to claim 1 wherein said transducer is acoustic.

3. A differential amplifier system according to claim 2 wherein said energy detecting active feedback means further comprises:
    acoustic detecting means for receiving said transducer output signal and for producing an output signal representative thereof;
    current generating means for producing an output current; and
    light generating means connected to receive said acoustic detecting means output signal and said output current for producing the optical output signal.

4. In an N channel differential amplifier system for normalizing the gains and levels of each channel wherein the channels are numbered sequentially as $N = 1, \ldots j \ldots n$, the jth channel comprising:
    oscillator means for generating an output signal having a predetermined frequency;
    input circuit means adapted to receive an input signal having common mode and differential mode components, and connected to receive said oscillator means output signal and common mode and differential mode feedback signals, and for supplying a first output signal;
    output circuit means connected to receive and amplify said first output signal for connection to a load and for providing an output signal having both common mode and differential mode components;
    light emitting active feedback means connected to receive said output circuit means output signal for optically transmitting only the differential mode component of said output signal at the predetermined frequency and for providing an output representative thereof; and
    light detecting active feedback means connected to receive said output circuit means output signal, said light emitting active feedback means output, and the output from the light emitting active feedback means of a predetermined one of the channels for providing the common mode and differential mode feedback signals to said input circuit means.

5. An N channel differential amplifier system according to claim 4 wherein said light emitting active feedback means further comprises:
    filter means connected to receive said output circuit means output signal for filtering therefrom the predetermined frequency and providing an output signal representative thereof;
    amplifier means connected to receive said filter means output signal for producing a differentially amplified output signal representative thereof;
    a current source for producing an output current; and
    light generating means connected to receive said amplifier means output signal and said output current for producing the light emitting active feedback means output signal.

6. An N channel differential amplifier system according to claim 5 wherein said light detecting active feedback means further comprises:
    first pair of phototransistors having photojunctions optically connected to receive said light emitting active feedback means output, emitters operatively connected in common to a voltage source, and collectors operatively connected for supplying the feedback signals to said input circuit means; and
    a second pair of phototransistors having photojunctions optically connected to receive the light emitting active feedback means output of the predetermined channel, emitters operatively connected in common to the emitters of said first pair of phototransistors, and collectors commonly connected to the collectors of said first pair of phototransistors.

* * * * *

UNITED STATES PATENT AND TRADEMARK OFFICE
CERTIFICATE OF CORRECTION

PATENT NO. : 3,955,149

DATED : 05-04-76

INVENTOR(S) : Ted R. Trilling

It is certified that error appears in the above–identified patent and that said Letters Patent are hereby corrected as shown below:

Column 15, line 39, after "loop" insert --comprises--.

Signed and Sealed this

Fourteenth Day of September 1976

[SEAL]

Attest:

RUTH C. MASON
*Attesting Officer*

C. MARSHALL DANN
*Commissioner of Patents and Trademarks*